United States Patent
Akiyama et al.

(10) Patent No.: US 10,103,021 B2
(45) Date of Patent: Oct. 16, 2018

(54) THERMALLY OXIDIZED HETEROGENEOUS COMPOSITE SUBSTRATE AND METHOD FOR MANUFACTURING SAME

(71) Applicant: SHIN-ETSU CHEMICAL CO., LTD., Tokyo (JP)

(72) Inventors: Shoji Akiyama, Annaka (JP); Yuji Tobisaka, Annaka (JP); Kazutoshi Nagata, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/366,125

(22) PCT Filed: Jan. 11, 2013

(86) PCT No.: PCT/JP2013/050387
§ 371 (c)(1),
(2) Date: Jun. 17, 2014

(87) PCT Pub. No.: WO2013/105634
PCT Pub. Date: Jul. 18, 2013

(65) Prior Publication Data
US 2014/0322546 A1    Oct. 30, 2014

(30) Foreign Application Priority Data

Jan. 12, 2012  (JP) ................. 2012-003856

(51) Int. Cl.
*H01L 21/324* (2006.01)
*H01L 21/02* (2006.01)
(Continued)

(52) U.S. Cl.
CPC .. *H01L 21/02238* (2013.01); *H01L 21/02255* (2013.01); *H01L 21/324* (2013.01);
(Continued)

(58) Field of Classification Search
CPC ......... H01L 21/02238; H01L 21/02255; H01L 21/324; H01L 21/7624; H01L 21/76251; H01L 29/0642; H01L 29/78603
See application file for complete search history.

(56) References Cited

U.S. PATENT DOCUMENTS 4,178,191 A * 12/1979 Flatley ..................... 438/165
4,509,990 A *  4/1985 Vasudev ............. H01L 21/0242
                                                            257/53
(Continued)

FOREIGN PATENT DOCUMENTS

CN    1989620    6/2007
EP    1 981 063 A1    10/2008
(Continued)

OTHER PUBLICATIONS

Extended European Search Report dated Aug. 19, 2015 issued in counterpart application No. 13736379.2 (6 pages).
(Continued)

*Primary Examiner* — Jonathan C Langman
(74) *Attorney, Agent, or Firm* — Westerman, Hattori, Daniels & Adrian, LLP

(57) ABSTRACT

A thermally oxidized heterogeneous composite substrate provided with a single crystal silicon film on a handle substrate, said heterogeneous composite substrate being obtained by, prior to a thermal oxidization treatment at a temperature exceeding 850° C., conducting an intermediate heat treatment at 650-850° C. and then conducting the thermal oxidization treatment at a temperature exceeding 850° C. According to the present invention, a thermally oxidized heterogeneous composite substrate with a reduced number of defects after thermal oxidation can be obtained.

11 Claims, 3 Drawing Sheets

(51) Int. Cl.
  *H01L 21/762* (2006.01)
  *H01L 29/06* (2006.01)
  *H01L 29/786* (2006.01)

(52) U.S. Cl.
  CPC .... *H01L 21/7624* (2013.01); *H01L 21/76251* (2013.01); *H01L 29/0642* (2013.01); *H01L 29/78603* (2013.01)

(56) References Cited

U.S. PATENT DOCUMENTS

| | | | | |
|---|---|---|---|---|
| 4,523,963 | A * | 6/1985 | Ohta | H01L 21/26506 257/354 |
| 5,395,788 | A * | 3/1995 | Abe et al. | 438/690 |
| 6,312,968 | B1 * | 11/2001 | Shimabukuro | G02F 1/13454 257/E21.632 |
| 6,403,450 | B1 * | 6/2002 | Maleville et al. | 438/471 |
| 6,649,535 | B1 | 11/2003 | Yu et al. | |
| 7,407,867 | B2 * | 8/2008 | Ghyselen et al. | 438/455 |
| 7,736,998 | B2 * | 6/2010 | Morita | H01L 21/3065 438/455 |
| 2002/0123211 | A1 | 9/2002 | Dolan et al. | |
| 2002/0142562 | A1 | 10/2002 | Chan et al. | |
| 2004/0229444 | A1 | 11/2004 | Couillard et al. | |
| 2005/0139927 | A1 | 6/2005 | Kim | |
| 2006/0268955 | A1 | 11/2006 | Cho et al. | |
| 2007/0087514 | A1 | 4/2007 | Hamamoto | |
| 2008/0254595 | A1 | 10/2008 | Kawai et al. | |
| 2008/0280420 | A1 | 11/2008 | Yamazaki | |
| 2009/0203191 | A1 | 8/2009 | Ohnuma et al. | |
| 2010/0273310 | A1 | 10/2010 | Hanaoka et al. | |
| 2011/0151644 | A1 | 6/2011 | Vaufredaz | |

FOREIGN PATENT DOCUMENTS

| | | |
|---|---|---|
| JP | 11-040682 A | 2/1999 |
| JP | H11-145438 A | 5/1999 |
| JP | H11-330438 A | 11/1999 |
| JP | 2006-32725 A | 2/2006 |
| JP | 2006-332649 A | 12/2006 |
| JP | 2008-263087 A | 10/2008 |
| JP | 2008-306166 A | 12/2008 |
| JP | 2011-138818 A | 7/2011 |
| WO | 2008/121262 A2 | 10/2008 |

OTHER PUBLICATIONS

International Search Report, dated Feb. 19, 2013, issued in corresponding application No. PCT/JP2013/050387.
Search Report and Written Opinion dated Jun. 16, 2015, issued in corresponding Singaporean application No. 11201404039U (11 pages).
Abe et al., "Fabrication and Bonding Strength of Bonded Silicon-Quartz Wafers", Jpn. J Appl. Phys, Jan. 1993, pp. 334-337, vol. 32, No. 1B, Cited in Singaporean Search Report and Written Opinion dated Jun. 16, 2015.
Office Action dated May 24, 2016, issued in counterpart Japanese Patent Application No. 2013-553323. (4 pages).
Written Opinion dated Feb. 10, 2016, issued in counterpart Singaporean Patent Application No. 11201404039U. (4 pages).
Naumova, O. V. et al., "Property of Silicon Nanolayers on Insulator", Materials Science and Engineering B, Dec. 15, 2006, vol. 135, No. 3, pp. 238-241.
Office Action dated Jul. 4, 2016, issued in counterpart Chinese Application No. 10520823720 (7 pages).
Office Action dated Oct. 24, 2017, issued in counterpart Japanese Application No. 2017-012743, with English translation (8 pages).

* cited by examiner

THERMALLY OXIDIZED HETEROGENEOUS COMPOSITE SUBSTRATE AND METHOD FOR MANUFACTURING SAME

TECHNICAL FIELD

This invention relates to a thermally oxidized heterogeneous composite substrate obtained from thermal oxidative treatment of a heterogeneous composite substrate comprising a single crystal silicon film formed on a handle substrate of glass, quartz, sapphire or the like, and a method for manufacturing the same.

BACKGROUND ART

Silicon on insulator (SOI) wafers are widely used for the purpose of reducing parasitic capacitance, thereby accelerating device performance. Attractive among SOI wafers are silicon on quartz (SOQ) and silicon on sapphire (SOS) in which the handle wafer is a transparent insulating wafer. SOQ is expected to find use in optoelectronic applications that take advantage of high transparency of quartz, or in high frequency devices that take advantage of a low dielectric loss of quartz. Since SOS whose handle substrate is made of sapphire has high transparency, a low dielectric loss, and a high thermal conductivity, which is unavailable from quartz. SOS is expected to find use in heat-generating high frequency devices.

For stacking of a single crystal layer of quality, it is ideal to form a silicon thin film by the bonding/transfer process from a bulk silicon wafer. While several processes including hetero-epitaxial growth of a silicon layer on R-face sapphire, and CG silicon process involving growth of non-single-crystal silicon on glass and subsequent laser annealing to improve crystallinity have been developed, allegedly none of them surpass the bonding process.

It is noted that bonded wafers of heterogeneous materials (e.g., SOQ, SOS and SOG) leave concerns about defects induced during the process. Specifically, typical device processes involve heat treatment at a high temperature in excess of 850° C. to form a gate oxide film. In these bonded substrates of heterogeneous materials, hereinafter referred to as "heterogeneous composite substrates," such high-temperature process applies strong compressive/tensile stresses to the silicon thin film to form various defects such as micro-cracks. The cause originating from the heterogeneous composite substrate is a substantial difference in coefficient of expansion between the support substrate known as "handle substrate" and the upper layer or silicon thin film. This is the essential problem of heterogeneous composite substrates.

SUMMARY OF INVENTION

Technical Problem

An object of the invention, which has been made under the above-mentioned circumstances, is to provide a thermally oxidized heterogeneous composite substrate having a minimized number of micro-cracks and other defects left after high-temperature treatment in excess of 850° C. to form an oxide layer, and a method for manufacturing the same.

Solution to Problem

Making extensive investigations to attain the above objects, the inventors have found that better results are obtained when a transparent insulating wafer (quartz, glass, sapphire or the like) having a silicon thin film transferred thereon is subjected to heat treatment, which may be referred to as previous heat treatment, prior to high-temperature treatment in excess of 850° C., and the temperature of the previous heat treatment ranges from 650° C. to 850° C.

Specifically, the previous heat treatment is a treatment at 650° C. to 650° C. for reducing defects which are otherwise formed during high-temperature treatment in excess of 850° C. The previous heat treatment is also regarded as a treatment for averaging localized stresses over the entire wafer surface. It is estimated that the localized stresses are caused by material strains and density gradation of the handle substrate, in-plane non-uniformity of the bonding process and the like.

Also, the previous heat treatment is a treatment for increasing the bond strength at the bonding interface to a sufficient level before the high-temperature treatment temperature is reached, for thereby preventing the silicon thin film from peeling or shifting when strong stresses are applied thereto.

High-temperature treatment, typically oxidative treatment is carried out subsequent to the previous heat treatment, with this sequence being effective for reducing the number of defects left after oxidation.

Accordingly, the present invention provides a thermally oxidized heterogeneous composite substrate and a method for manufacturing the same, as defined below.

[1] A thermally oxidized heterogeneous composite substrate, obtained by subjecting a heterogeneous composite substrate comprising a single crystal silicon film on a handle substrate to previous heat treatment at 650 to 850° C. prior to thermal oxidative treatment at a temperature in excess of 850° C., and thereafter conducting thermal oxidative treatment at a temperature in excess of 850° C.

[2] The thermally oxidized heterogeneous composite substrate of [1] wherein the handle substrate is made of glass, quartz or sapphire.

[3] The thermally oxidized heterogeneous composite substrate of [1] or [2] wherein a buried oxide layer intervenes between the handle substrate and the single crystal silicon film.

[4] The thermally oxidized heterogeneous composite substrate of any one of [1] to [3] wherein the previous heat treatment is conducted in an atmosphere of argon, nitrogen, oxygen, hydrogen, helium or a mixture of an inert gas and oxygen.

[5] The thermally oxidized heterogeneous composite substrate of any one of [1] to [4] wherein the handle substrate has a coefficient of thermal expansion of 0.54 to 7.4 ppm at 400° C. or lower.

[6] The thermally oxidized heterogeneous composite substrate of [5] wherein the handle substrate is made of sapphire, a sapphire wafer having a coefficient of expansion of up to 7.4 ppm at room temperature to 400° C.

[7] A method for manufacturing a thermally oxidized heterogeneous composite substrate, comprising the steps of subjecting a heterogeneous composite substrate comprising a single crystal silicon film on a handle substrate to previous heat treatment at 650 to 850° C., and thereafter conducting thermal oxidative treatment at a temperature in excess of 850° C.

[8] A method for manufacturing a thermally oxidized heterogeneous composite substrate according to [7] wherein the handle substrate is made of glass, quartz or sapphire.

[9] A method for manufacturing a thermally oxidized heterogeneous composite substrate according to [7] or [8]

wherein the heterogeneous composite substrate comprises a buried oxide layer disposed between the handle substrate and the single crystal silicon film.

[10] A method for manufacturing a thermally oxidized heterogeneous composite substrate according to any one of [7] to [9] wherein the previous heat treatment is conducted in an atmosphere of argon, nitrogen, oxygen, hydrogen, helium or a mixture of an inert gas and oxygen.

[11] A method for manufacturing a thermally oxidized heterogeneous composite substrate according to any one of [7] to [10] wherein the handle substrate has a coefficient of thermal expansion of 0.54 to 7.4 ppm at 400° C. or lower.

[12] A method for manufacturing a thermally oxidized heterogeneous composite substrate according to [11] wherein the handle substrate is made of sapphire, a sapphire wafer having a coefficient of expansion of up to 7.4 ppm at room temperature, to 400° C.

Advantageous Effects of Invention

According to the invention, a thermally oxidized heterogeneous composite substrate having a minimized number of defects after thermal oxidation is available.

DESCRIPTION OF EMBODIMENTS

Figure 1:
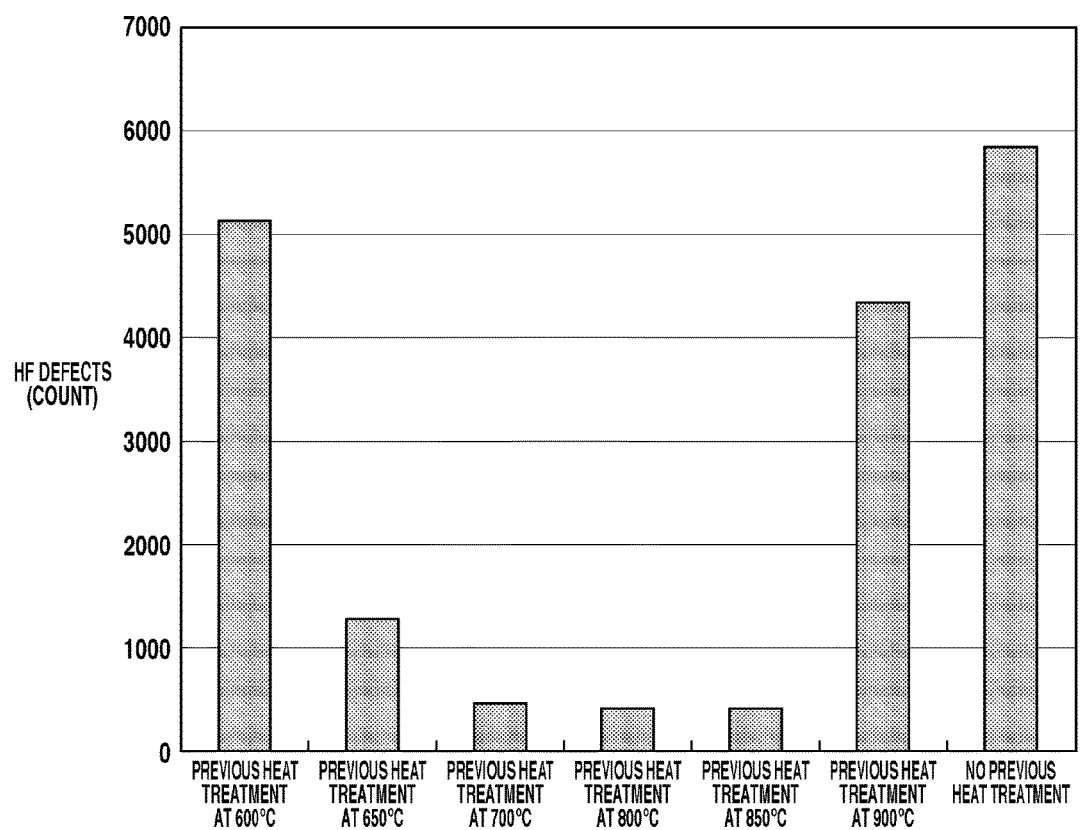
FIG. 1 is a graph plotting the number of HF defects in thermally oxidized SOS wafer substrates when previous heat treatment is conducted at varying temperatures.

According to the invention, a thermally oxidized heterogeneous composite substrate is obtained by subjecting a heterogeneous composite substrate comprising a single crystal silicon film on a handle substrate to previous heat treatment at 650 to 850° C., and thereafter conducting thermal oxidative treatment at a temperature, in excess of 850° C.

Herein, a buried oxide (BOX) layer may intervene between the handle substrate and the single crystal silicon film.

In the composite substrate to which the invention pertains, the material of which the handle substrate is made is typically glass, quartz or sapphire. These materials have a coefficient of expansion (CE) largely different from silicon. Their CE is shown in Table 1.

TABLE 1

| Material | Silicon | Quartz | Sapphire (C-face, perpendicular to C axis) | Sapphire (A-face, parallel to C axis) |
|---|---|---|---|---|
| CE ($\times 10^{-6}$/K = ppm) | 2.6 | 0.54 | 7.0 (up to 400° C.) | 7.7 (up to 400° C.) |

SOQ obtained by bonding silicon to quartz has a CE difference of 2.04 ppm, and SOS has a CE difference of 4.4 ppm at minimum and 5.1 ppm at maximum. Since the CE of sapphire varies with orientation, a choice of a sapphire substrate having a low CE for reducing the CE difference may further increase the benefits of the invention. Specifically, it is effective to use C-face wafers (7.0 ppm) or R-face wafers (~7.4 ppm) rather than A-face wafers having a high CE.

Accordingly, in a preferred embodiment, the handle substrate has a coefficient of thermal expansion (CTE) of 0.54 to 7.4 ppm at 400° C. or lower, and a sapphire wafer has a CE of up to 7.4 ppm at room temperature to 400° C.

Also preferably, the handle substrate has a thickness of 500 to 800 μm, especially 600 to 725 μm, and the single crystal silicon film has a thickness of 50 to 500 nm, especially 100 to 350 nm. The buried oxide (BOX) layer, when interposed, preferably has a thickness of 25 to 150 nm. It is noted that the BOX layer may be formed by the same method as disclosed in JP-A 2002-305292 with regard to the formation of BOX layer in SOI wafer.

Before the heterogeneous composite substrate is sub acted to thermal oxidative treatment, previous heat treatment is carried out at a temperature of 650 to 850° C., preferably 700 to 850° C.

The atmosphere of previous heat treatment is not particularly limited as long as it is easy to handle. Typical of the atmosphere are argon, nitrogen, oxygen, hydrogen, and helium. A mixture of an inert gas such as argon or nitrogen with an oxidizing gas is acceptable.

The time of previous heat treatment is preferably 0.5 to 6 hours, especially 1 to 3 hours. Too short a time may fail to achieve the object of the invention whereas too long a time may invite a cost increase.

The previous heat treatment is followed by thermal oxidative treatment. The conditions used in the thermal oxidative treatment may be selected from well-known conditions. The heat treatment temperature should exceed 850° C., and is preferably from higher than 900° C. to 1,000° C., more preferably 950 to 1,000° C., although the heat treatment temperature is not particularly limited as long as an oxide film of the desired thickness is available. When a heat treatment temperature in excess of 500° C. is selected, the previous heat treatment may be at a temperature of 550 to 900° C., especially 700 to 900° C. The heat treatment atmosphere is typically dry oxygen or water vapor.

The heat treatment time is not particularly limited as long as an oxide film of the desired thickness is available.

According to the invention, a thermally oxidized heterogeneous composite substrate having an outstandingly reduced number of defects is obtained. The number of defects in a composite substrate may be determined by a HF immersion test. In the test, SOQ or SOS is immersed in a HF solution, with which the inside buried oxide (BOX) layer is etched via defects, during which defects are enlarged to a sufficient size to be detectable even under an optical microscope. Easy inspection is possible with this test as long as the BOX layer has a thickness of 25 to 500 nm. If the BOX layer is too thin, HF may not penetrate. If the BOX layer is too thick, HF may penetrate too fast, which is detrimental to inspection.

EXAMPLES

Examples of the invention are given below by way of illustration and not by way of limitation.

Example 1

There were provided a plurality of SOS wafers including a sapphire wafer (R-face) of 150 mm diameter and 600 μm thick as the handle substrate. The silicon layer had a thickness of 200 nm, and the BOX layer had a thickness of 200 nm. The wafers were subjected to previous heat treatment at 600° C., 650° C., 700° C., 800° C., 850° C., and 900° C. The atmosphere was argon, and the holding time was 1 hour. One more wafer was provided as a reference without previous heat treatment. On these wafers, wet oxidation was carried out at 1,000° C. to form an oxide film of 200 nm thick. The wafers as oxidized were immersed in 10% HF solution for 30 minutes, after which the number of defects was counted, with the results shown in FIG. 1. Where previous heat treatment was at 650° C. to 850° C., the number of defects was reduced. Where previous heat treatment was at 600° C., the number of defects was not so reduced, probably because 600° C. was an insufficient temperature to gain the desired effect. Where previous heat treatment was at 900° C., defects formed already during the previous heat treatment. The optimum temperature seems to range from 650° C. to 850° C.

Example 2

Figure 2:
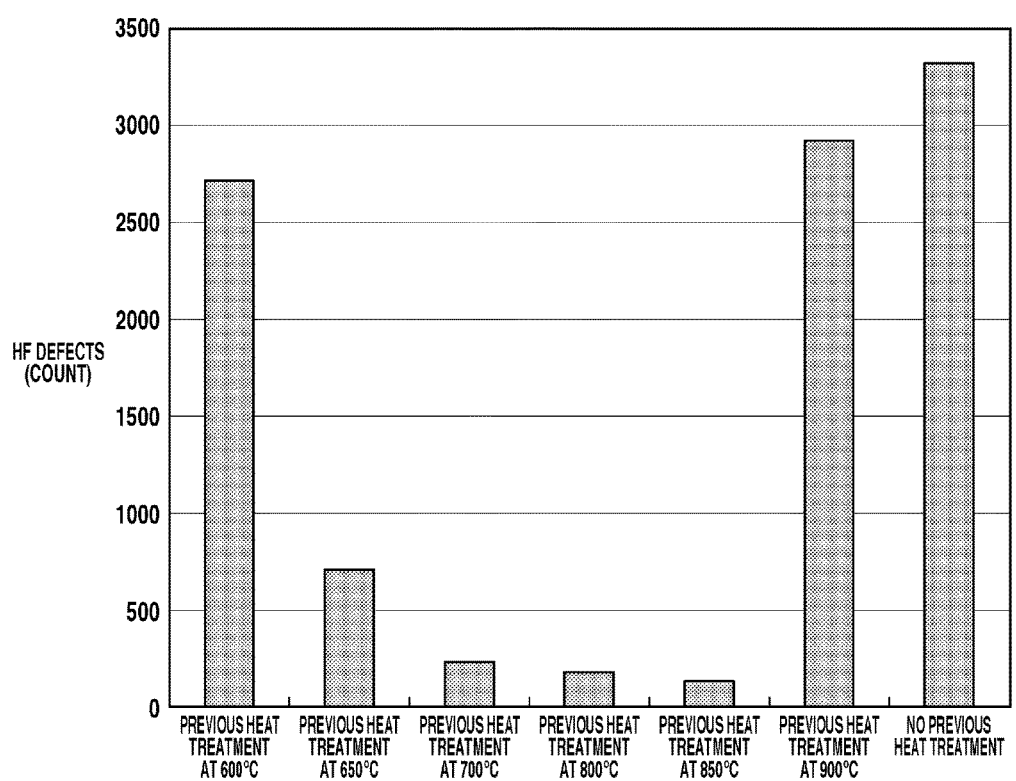
FIG. 2 is a graph plotting the number of HF defects in thermally oxidized SOQ wafer substrates when previous heat treatment is conducted at varying temperatures.

There were provided a plurality of SOQ wafers including a quartz wafer of 150 mm diameter and 625 µm thick as the handle substrate. The silicon layer had a thickness of 200 nm, and the BOX layer had a thickness of 200 nm. The wafers were subjected to previous heat treatment at 600° C., 650° C., 700° C., 800° C., 850° C., and 900° C. The atmosphere was argon, and the holding time was 1 hour. One more wafer was provided as a reference without previous heat treatment. On these wafers, wet oxidation was carried out at 950° C. to form an oxide film of 200 nm thick. The wafers as oxidized were immersed in 10% HF solution for 30 minutes, after which the number of defects was counted, with the results shown in FIG. 2. Where previous heat treatment was at 650° C. to 850° C., the number of defects was reduced. Where previous heat treatment was at 600° C., the number of defects was not so reduced, probably because 600° C. was an insufficient temperature to gain the desired effect. Where previous heat treatment was at 900° C., detects formed already during the previous heat treatment. The optimum temperature seems to range from 650° C. to 850° C.

Example 3

Figure 3:
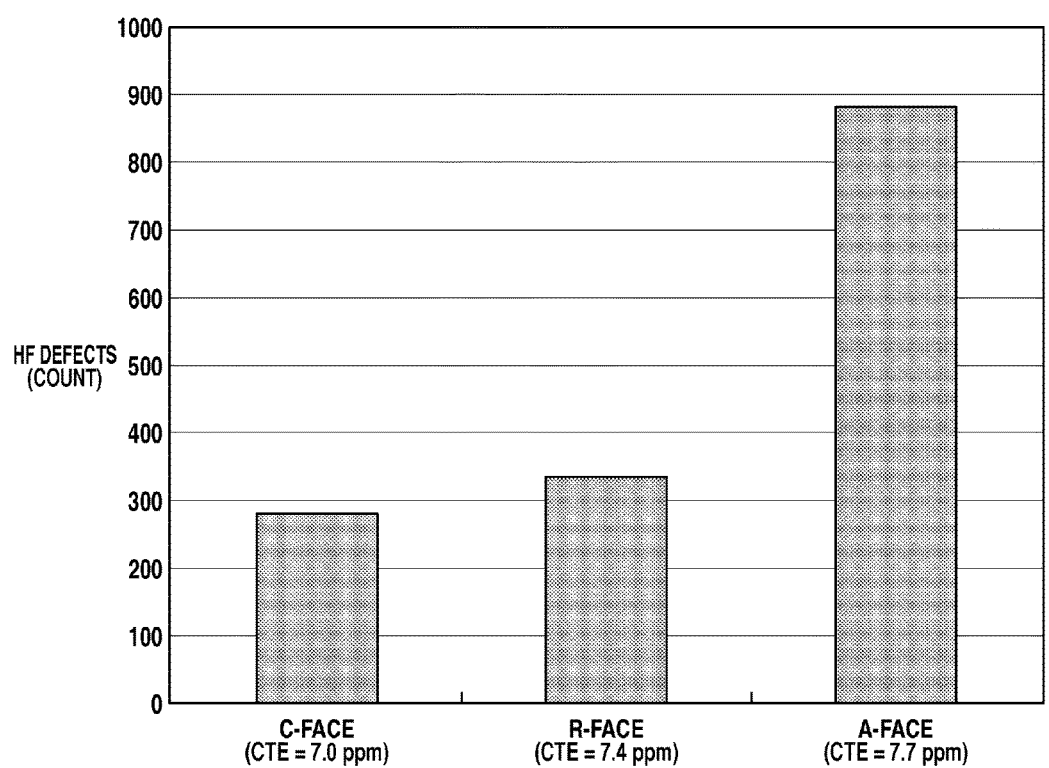
FIG. 3 is a graph plotting the number of HF defects in thermally oxidized SOS wafer substrates when previous heat treatment is conducted on SOS wafers having a single crystal silicon film in varying sapphire orientations.

There were provided a plurality of SOS wafers including a sapphire wafer of 150 mm diameter and 600 µm thick as the handle substrate. With respect to orientation, the sapphire wafers included. C-face (CTE=7.0 ppm), R-face (CTE=7.4 ppm), and A-face (CTE=7.7 ppm) wafers. The silicon layer had a thickness of 200 nm, and the BOX layer had a thickness of 200 nm. The wafers were subjected to previous heat treatment at 800° C. The atmosphere was argon, and the holding time was 1 hour. On these wafers, wet oxidation was carried out at 1,000° C. to form an oxide film of 200 nm thick. The wafers as oxidized were immersed in 10% HF solution for 30 minutes, after which the number of defects was counted, with the results shown in FIG. 3. In the case of C-face and R-face, the number of defects was reduced more effectively than in the case of A-face.

Although the inventive method is illustrated with reference to specific examples using quartz and sapphire, the invention is equally effective when materials having an intermediate CTE (0.54 to 7.4 ppm) between quartz and sapphire are used as the handle substrate.

The invention claimed is:

1. A method for manufacturing a thermally oxidized heterogeneous composite substrate comprising subjecting a heterogeneous composite substrate, comprising a single crystal silicon film transferred onto a handle substrate which is a transparent insulating wafer, to thermal oxidative treatment at a temperature in excess of 850° C. to form an oxide film, wherein said thermal oxidative treatment is carried out immediately after a preliminary heat treatment of the heterogeneous composite substrate at 650 to 850° C. for 0.5 to 6 hours, to reduce the formation of defects during the thermal oxidative treatment.

2. A method for manufacturing a thermally oxidized heterogeneous composite substrate according to claim 1 wherein the handle substrate is made of glass, quartz or sapphire.

3. A method for manufacturing a thermally oxidized heterogeneous composite substrate according to claim 1 wherein the heterogeneous composite substrate comprises a buried oxide layer disposed between the handle substrate and the single crystal silicon film.

4. A method for manufacturing a thermally oxidized heterogeneous composite substrate according to claim 1 wherein the preliminary heat treatment is conducted in an atmosphere of argon, nitrogen, oxygen, hydrogen, helium or a mixture of an inert gas and oxygen.

5. A method for manufacturing a thermally oxidized heterogeneous composite substrate according to claim 1 wherein the handle substrate has a coefficient of thermal expansion of 0.54 to 7.4 ppm at 400° C. or lower.

6. A method for manufacturing a thermally oxidized heterogeneous composite substrate according to claim 5 wherein the handle substrate is made of sapphire, a sapphire wafer having a coefficient of expansion of up to 7.4 ppm at room temperature to 400° C.

7. A method for manufacturing a thermally oxidized heterogeneous composite substrate according to claim 1, the thermal oxidative treatment temperature is from higher than 900° C. to 1,000° C.

8. A method for manufacturing a thermally oxidized heterogeneous composite substrate according to claim 1, the thermal oxidative treatment is to form a gate oxide film.

9. The method for manufacturing a thermally oxidized heterogeneous composite substrate according to claim 1, wherein the handle substrate has a thickness of 500 to 800 µm, and the single crystal silicon film has a thickness of 50 to 500 nm.

10. The method for manufacturing a thermally oxidized heterogeneous composite substrate according to claim 1, wherein the heterogeneous composite substrate is an SOQ wafer, an SOS wafer or an SOG wafer.

11. The method for manufacturing a thermally oxidized heterogeneous composite substrate according to claim 1, wherein the temperature of the preliminary heat treatment ranges from 700° C. to 850° C.

* * * * *